(12) United States Patent
Na et al.

(10) Patent No.: US 7,710,799 B2
(45) Date of Patent: May 4, 2010

(54) CIRCUIT FOR GENERATING DATA STROBE IN DDR MEMORY DEVICE, AND METHOD THEREFOR

(75) Inventors: Kwang Jin Na, Anyang-Shi (KR); Young Bae Choi, Suwon-Shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 529 days.

(21) Appl. No.: 11/611,922

(22) Filed: Dec. 18, 2006

(65) Prior Publication Data

US 2007/0101224 A1    May 3, 2007

Related U.S. Application Data

(62) Division of application No. 10/879,878, filed on Jun. 29, 2004, now Pat. No. 7,173,866.

(30) Foreign Application Priority Data

Apr. 20, 2004 (KR) ................... 2004-27097

(51) Int. Cl.
*G11C 7/00*    (2006.01)

(52) U.S. Cl. .............. 365/193; 365/191; 365/233.11; 365/233.13

(58) Field of Classification Search ................ 365/193, 365/191, 233.11, 233.13
See application file for complete search history.

(56) References Cited

U.S. PATENT DOCUMENTS

| 6,215,710 | B1 * | 4/2001 | Han et al. ............ 365/193 |
| 6,687,169 | B2 | 2/2004 | Ryu et al. |
| 6,940,321 | B2 * | 9/2005 | Heo et al. ............ 327/112 |
| 7,173,866 | B2 | 2/2007 | Na et al. |

* cited by examiner

*Primary Examiner*—Hoai V Ho
*Assistant Examiner*—Kretelia Graham
(74) *Attorney, Agent, or Firm*—Marshall, Gerstein & Borun LLP

(57) ABSTRACT

The present invention discloses a circuit for generating a data strobe signal in a DDR memory device and a method therefor which can precisely distinguish preamble and postamble periods of the data strobe signal by generating pulses for generating the data strobe signal only in a data strobe signal input period by using an internal clock signal according to CAS latency under a read command, and generating the data strobe signal by using the pulses, and which can improve reliability of the circuit operation by precisely controlling operation timing with the internal clock signal.

15 Claims, 9 Drawing Sheets

CIRCUIT FOR GENERATING DATA STROBE IN DDR MEMORY DEVICE, AND METHOD THEREFOR

CROSS-REFERENCE TO RELATED APPLICATION

This patent is a division of U.S. Ser. No. 10/879,878, filed Jun. 29, 2004, the disclosure of which is hereby expressly incorporated herein for all purposes.

FIELD OF THE INVENTION

The present invention relates to a circuit for generating a data strobe signal (DQS) in a DDR memory device and a method therefor, and more particularly to, a circuit for generating a DQS in a DDR memory device which can precisely control preamble and postamble periods of the input/output DQS, and a method therefor.

DISCUSSION OF RELATED ART

As publicly known, a synchronous DRAM (SDRAM) synchronized with an external system clock has been widely used to improve an operation speed among the semiconductor devices. The general SDRAM uses only a rising edge of a clock, but the DDR SDRAM uses both rising and falling edges of a clock to improve an operation speed. Therefore, the DDR SDRAM is expected as a next generation DRAM. On the other hand, a data strobe signal (DQS) is used to minimize a time skew generated between chips of a memory chip set during the data read operation. The DQS will now be briefly explained.

FIG. 1 is a waveform diagram illustrating the DQS.

FIG. 1 shows timing in the data read operation of the DDR SDRAM, especially when CAS latency (CL) for defining a clock number from a read command input clock time point to a data output time point is 2 and when a burst length (BL) for defining a number of consecutively-processed data is 4.

In the read operation of the DDR SDRAM, when the DQS is enabled, the data must be outputted in the rising and falling edges. Here, the DQS must pass through a preamble state before one clock from data output, and pass through a postamble state for half a clock even after last data output.

Before the preamble state, the DQS may maintain a high impedance (high-z) state which is an intermediate level between high and low states, or maintain a high level in a ultrahigh speed memory device such as the GDDR III. In this case, it is difficult to set or distinguish the preamble or postamble period of the DQS. Especially, an operation margin is reduced due to a high operation speed. It is thus more difficult to precisely set the preamble or postamble period of the DQS. As a result, the data read operation is not efficiently performed.

SUMMARY OF THE INVENTION

The present invention is directed to a circuit for generating a data strobe signal in a DDR memory device and a method therefor which can precisely distinguish preamble and postamble periods of the data strobe signal by generating pulses for generating the data strobe signal only in a data strobe signal input period by using an internal clock signal according to CAS latency under a read command, and generating the data strobe signal by using the pulses, and which can improve reliability of the circuit operation by precisely controlling operation timing with the internal clock signal.

One aspect of the present invention is to provide a circuit for controlling data output and data strobe signal generation in a DDR memory device, including: an internal clock generating unit for generating first and second internal clock signals; an enable signal generating unit for generating first to fourth enable signal signals according to a CAS latency and the first internal clock signal by receiving an external clock signal; a first pulse generating unit for outputting first and second pulse signals to control the data output by receiving the first and second enable signals and the second clock signal; and a second pulse generating unit for outputting third and fourth pulse signals to control the data strobe signal generation by receiving the third and fourth enable signals and the first clock signal.

According to another aspect of the present invention, a circuit for generating a data strobe signal in a DDR memory device, includes: an internal clock generating unit for generating first and second internal clock signals; an output enable signal generating unit for sequentially generating single pulse output enable signals at a predetermined interval; an output enable signal selecting unit for selecting three of the output enable signals according to CAS latency, and outputting the three output enable signals as first to third select signals; a first enable signal generating unit for generating first and second enable signals according to the second select signal and the first internal clock signal, respectively; a second enable signal generating unit for generating the third and fourth enable signals according to the first and third select signals and the first internal clock signal, respectively; a pulse generating unit for generating first and second pulses for controlling data output by outputting the second internal clock signal according to the first and second enable signals, and generating third and fourth pulses for generating the data strobe signal by outputting the first internal clock signal according to the third and fourth enable signals; and a data strobe signal generating unit for generating the data strobe signal by transiting a predetermined signal from a high to low level or a low to high level in every rising edge of the third or fourth pulse.

Here, the output enable signal generating unit generates the output enable signals to have a two cycle pulse width in every one cycle.

The output enable signal selecting unit outputs the three output enable signals consecutively generated at one cycle interval among the output enable signals as the first to third select signals.

The output enable signal selecting unit includes: a first selecting unit for outputting the second output enable signal as the second select signal according to the CAS latency; a second selecting unit for outputting the output enable signal later than the second output enable signal by one cycle as the third select signal according to the CAS latency; and a third selecting unit for outputting the output enable signal earlier than the second output enable signal by one cycle as the first select signal according to the CAS latency.

The first enable signal generating unit includes: a first buffer unit for outputting the second select signal as the first enable signal; a delay unit for generating the second enable signal different from the first enable signal by half a cycle by synchronizing a rising edge of the second select signal with a rising edge of the first internal clock signal; and a second buffer unit for outputting the second enable signal.

The second enable signal generating unit includes: a first inverter for inverting the first select signal; a second inverter for inverting the second select signal; a first NAND gate operated according to the output signals from the first and second inverters; a first buffer unit for outputting the output signal from the first NAND gate as the third enable signal; a second NAND gate operated according to the output signal from the second inverter and an inverted signal of the second select signal; a delay unit for generating the fourth enable signal different from the third enable signal by half a cycle by synchronizing a rising edge of the output signal from the second NAND) gate with a rising edge of the first internal clock signal; and a second buffer unit for outputting the fourth enable signal.

The delay unit is a D flip-flop using a clock signal as the first internal clock signal.

The pulse generating unit includes: a first pulse generating unit for generating the first pulse by outputting the second internal clock signal during the application of the first enable signal; a second pulse generating unit for generating the second pulse by outputting the second internal clock signal during the application of the second enable signal; a third pulse generating unit for generating the third pulse by outputting the first internal clock signal during the application of the third enable signal; and a fourth pulse generating unit for generating the fourth pulse by outputting the first internal clock signal during the application of the fourth enable signal.

The first pulse generating unit includes: a first inverter for inverting the second internal clock signal; a second inverter for inverting the first enable signal; and a NAND gate for generating the first pulse by outputting the output signal from the first inverter during the application of the output signal from the second inverter.

The second pulse generating unit includes: a first inverter for inverting the second internal clock signal; a second inverter for inverting the second enable signal; and a NAND gate for generating the second pulse by outputting the output signal from the first inverter during the application of the output signal from the second inverter.

The third pulse generating unit includes: a first inverter for inverting the first internal clock signal; a second inverter for inverting the third enable signal; and a NAND gate for generating the third pulse by outputting the output signal from the first inverter during the application of the output signal from the second inverter.

The fourth pulse generating unit includes: a first inverter for inverting the first internal clock signal; a second inverter for inverting the fourth enable signal; and a NAND gate for generating the fourth pulse by outputting the output signal from the first inverter during the application of the output signal from the second inverter.

According to Further another aspect of the present invention, a method for generating a data strobe signal in a DDR memory device includes the steps of: selecting three consecutive output enable signals from single pulse output enable signals generated at a predetermined interval as first to third select signals; generating a first enable signal by using the second select signal, generating a second enable signal different from the first enable signal by half a cycle by delaying the first enable signal, generating a third enable signal longer in the front and rear sides than the first enable signal by one cycle by using the first and third select signals, and generating a fourth enable signal longer in the front and rear sides than the first enable signal by half a cycle by using the first and third select signals; generating a first pulse by outputting a first internal clock signal during the application of the first enable signal, generating a second pulse by outputting the first internal clock signal during the application of the second enable signal, generating a third pulse by outputting a second internal clock signal during the application of the third enable signal, and generating a fourth pulse by outputting the second internal clock signal during the application of the fourth enable signal; and generating the data strobe signal by transiting a predetermined signal from a high to low level or a low to high level in every rising edge of the third or fourth pulse.

The output enable signals are generated to have a two cycle pulse width.

The output enable signals are selected as the first to third select signals according to CAS latency.

The first internal clock signal is an inverted signal of the second internal clock signal.

One cycle from the first rising edge of the third pulse is set to be a preamble period of the data strobe signal, and half a cycle from the last rising edge of the third pulse is set to be a postamble period of the data strobe signal.

The data are outputted in every rising edge of the first or second pulse.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Figure 1:
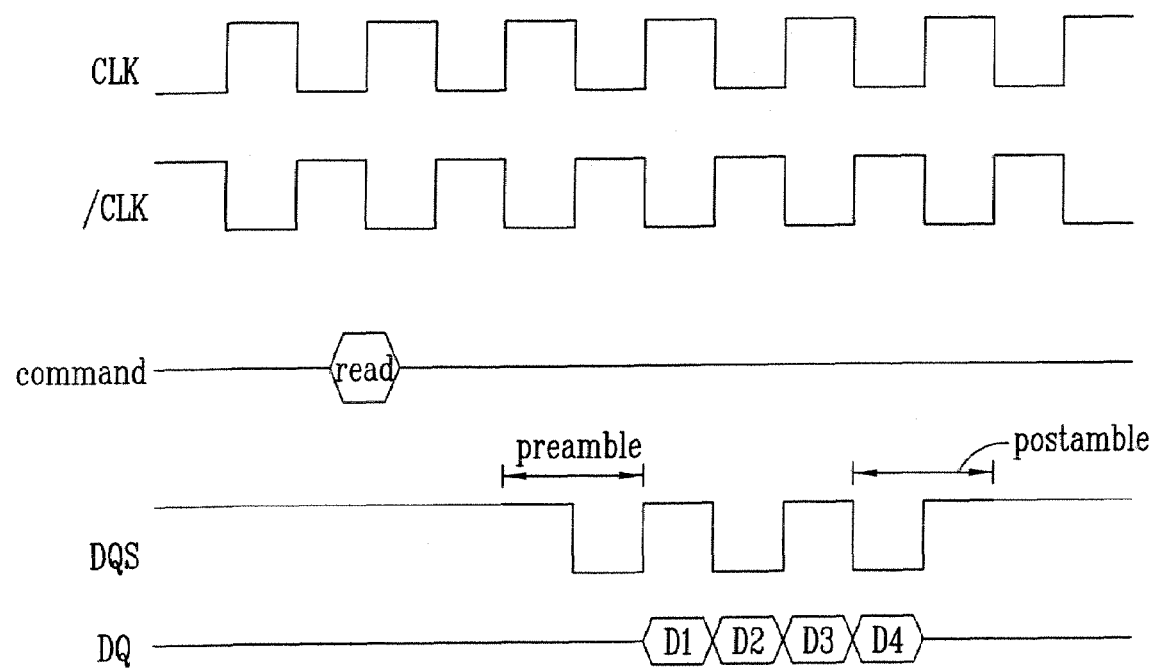
FIG. 1 is a waveform diagram showing a DQS.

A circuit for generating a data strobe signal (DQS) in a DDR memory device and a method therefor in accordance with a preferred embodiment of the present invention will now be described in detail with reference to the accompanying drawings. Wherever possible, the same reference numerals will be used throughout the drawings and the description to refer to the same or like parts.

Figure 2:
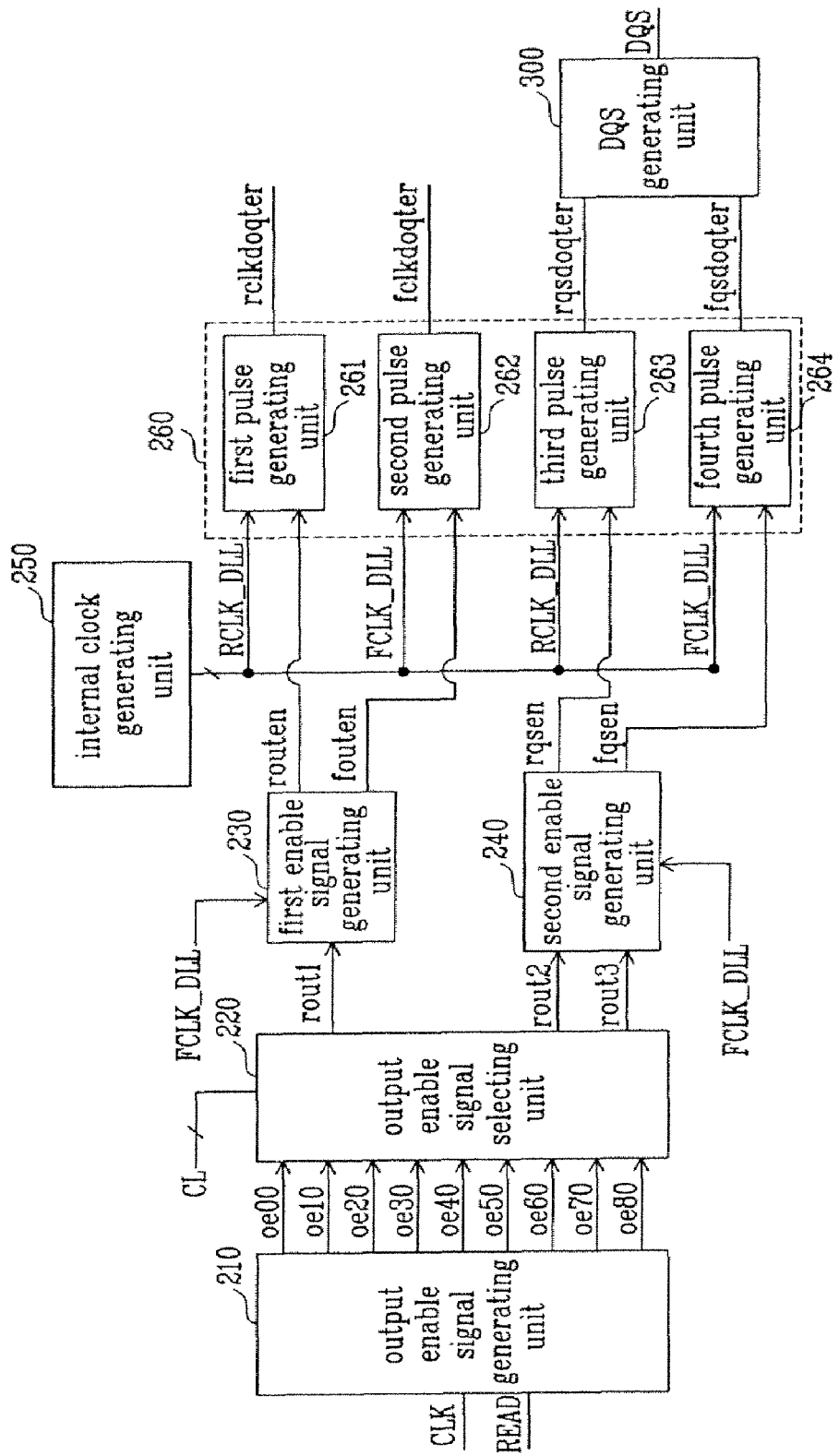
FIG. 2 is a circuit diagram illustrating a circuit for generating a DQS in a DDR memory device in accordance with a preferred embodiment of the present invention.

FIG. 2 is a circuit diagram illustrating the circuit for generating the DQS in the DDR memory device in accordance with the preferred embodiment of the present invention.

Referring to FIG. 2, the circuit for generating the DQS in the DDR memory device includes an output enable signal generating unit 210, an output enable signal selecting unit 220, a first enable signal generating unit 230, a second enable signal generating unit 240, an internal clock generating unit 250 and a pulse generating unit 260.

Figure 3:
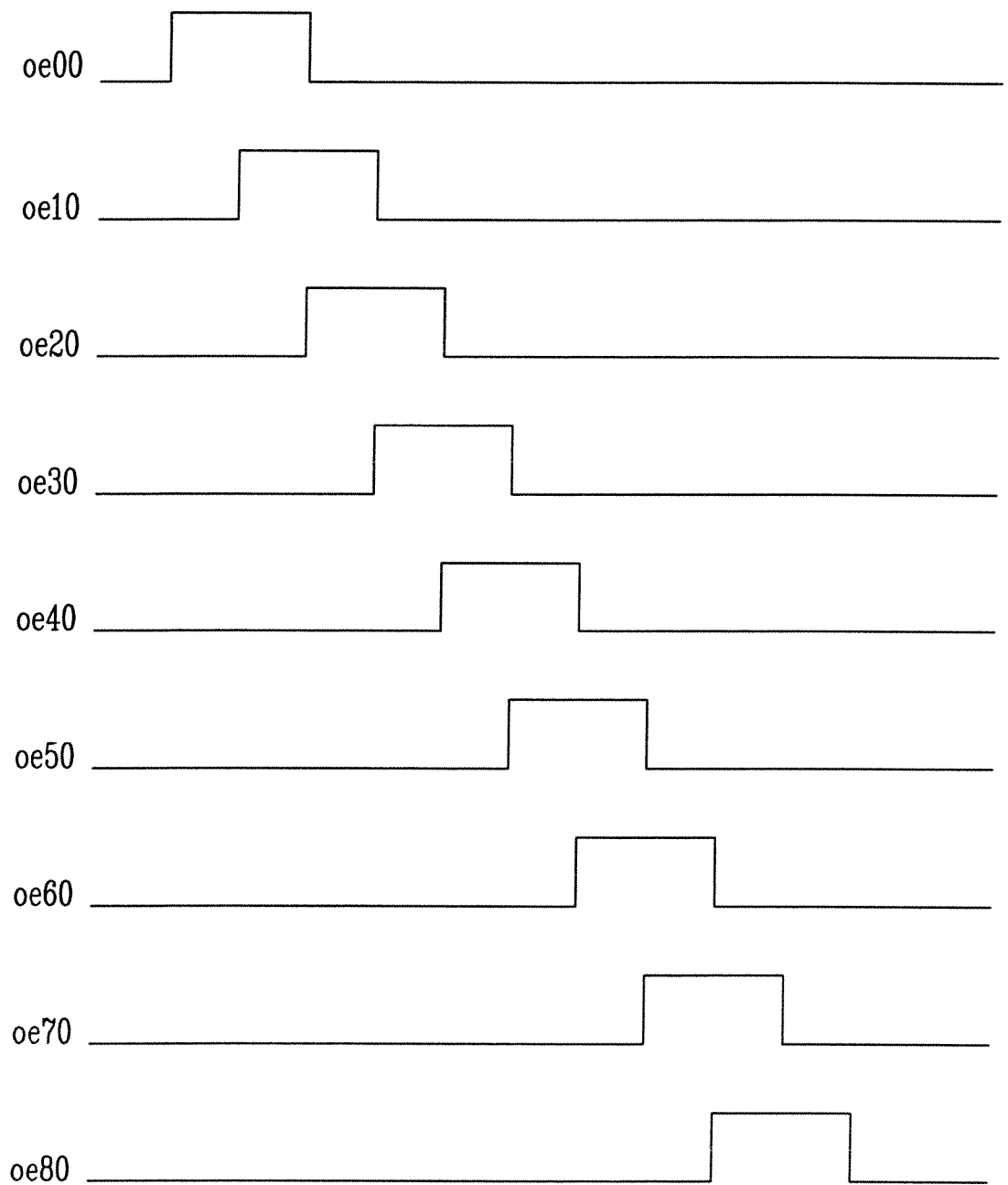
FIG. 3 is a waveform diagram showing output signals from an output enable signal generating unit of FIG. 2.

The output enable signal generating unit 210 generates a plurality of output enable signals oe00 to oe80 in response to a read command signal READ by synchronizing with a clock signal CLK. As shown in FIG. 3, the plurality of output enable signals oe00 to oe80 are sequentially generated in every one cycle to have a width corresponding to two cycles of the clock signal CLK. The output enable signal generating unit 210 has been publicly known and widely used.

The output enable signal selecting unit 220 selects specific signals from the signals oe00 to oe80 generated in the output enable signal generating unit 210 according to a CAS latency signal CL. Here, three signals are selected and outputted as first to third select signals rout1, rout2 and rout3.

The first enable signal generating unit 230 generates first and second enable signals routen and fouten for generating pulses for controlling data output according to the first select signal rout1 from the output enable signal selecting unit 220 and a first internal clock signal FCLK_DLL from the internal clock generating unit 250. Here, a pulse width of the first and second enable signals routen and fouten is dependent upon a pulse width of the first select signal rout1 outputted from the output enable signal selecting unit 220 according to the CAS latency CL.

The second enable signal generating unit 240 generates third and fourth enable signals rqsen and fqsen for generating pulses for generating the DQS according to the second and third select signals rout2 and rout3 from the output enable signal selecting unit 220 and the first internal clock signal FCLK_DLL from the internal clock generating unit 250. Here, a pulse width of the third and fourth enable signals rqsen and fqsen is dependent upon a combined pulse width of the second and third select signals rout2 and rout3 outputted from the output enable signal selecting unit 220 according to the CAS latency CL.

The pulse generating unit 260 generates first and second pulses rclkdoqter and fclkdoqter for controlling data output during the application of the first and second enable signals routen and fouten from the first enable signal generating unit 230, respectively, and also generates third and fourth pulses rqsdoqter and fqsdoqter for generating the DQS during the application of the third and fourth enable signals rqsen and fqsen from the second enable signal generating unit 240, respectively. Here, the first and second internal clock signals FCLK DLL and RCLK_DLL are outputted from the internal clock generating unit 250 during the application of the first to fourth enable signals routen, fouten, rqsen and fqsen to generate the first to fourth pulses rclkdoqter, fclkdoqter, rqsdoqter and fqsdoqter.

The pulse generating unit 260 includes first to fourth pulse generating units 261 to 264 for generating the first to fourth pulses rclkdoqter, fclkdoqter, rqsdoqter and fqsdoqter, respectively.

The third and fourth pulses rqsdoqter and fqsdoqter are used to generate the DQS. The DQS generating unit 300 transits a high level to a low level and a low level to a high level in every rising edge of the third or fourth pulse rqsdoqter or fqsdoqter, thereby generating the DQS. A circuit for transiting a level of a signal in every rising edge has been publicly known, and thus explanations of the DQS generating unit 300 are omitted.

Here, one cycle from the first rising edge of the earliest pulse of the third and fourth pulses rqsdoqter and fqsdoqter generated in the pulse generating unit 260 is deemed to be a preamble period of the DQS, and half a cycle from the last rising edge of the latest pulse of the third and fourth pulses rqsdoqter and fqsdoqter is deemed to be a postamble period of the DQS.

On the other hand, the data are outputted in every rising edge of the first or second pulse rclkdoqter or fclkdoqter.

The operation of the circuit for generating the DQS in the DDR memory device in accordance with the preferred embodiment of the present invention will now be described in more detail with reference to the accompanying detailed circuit diagrams and waveform diagrams.

Figure 4:
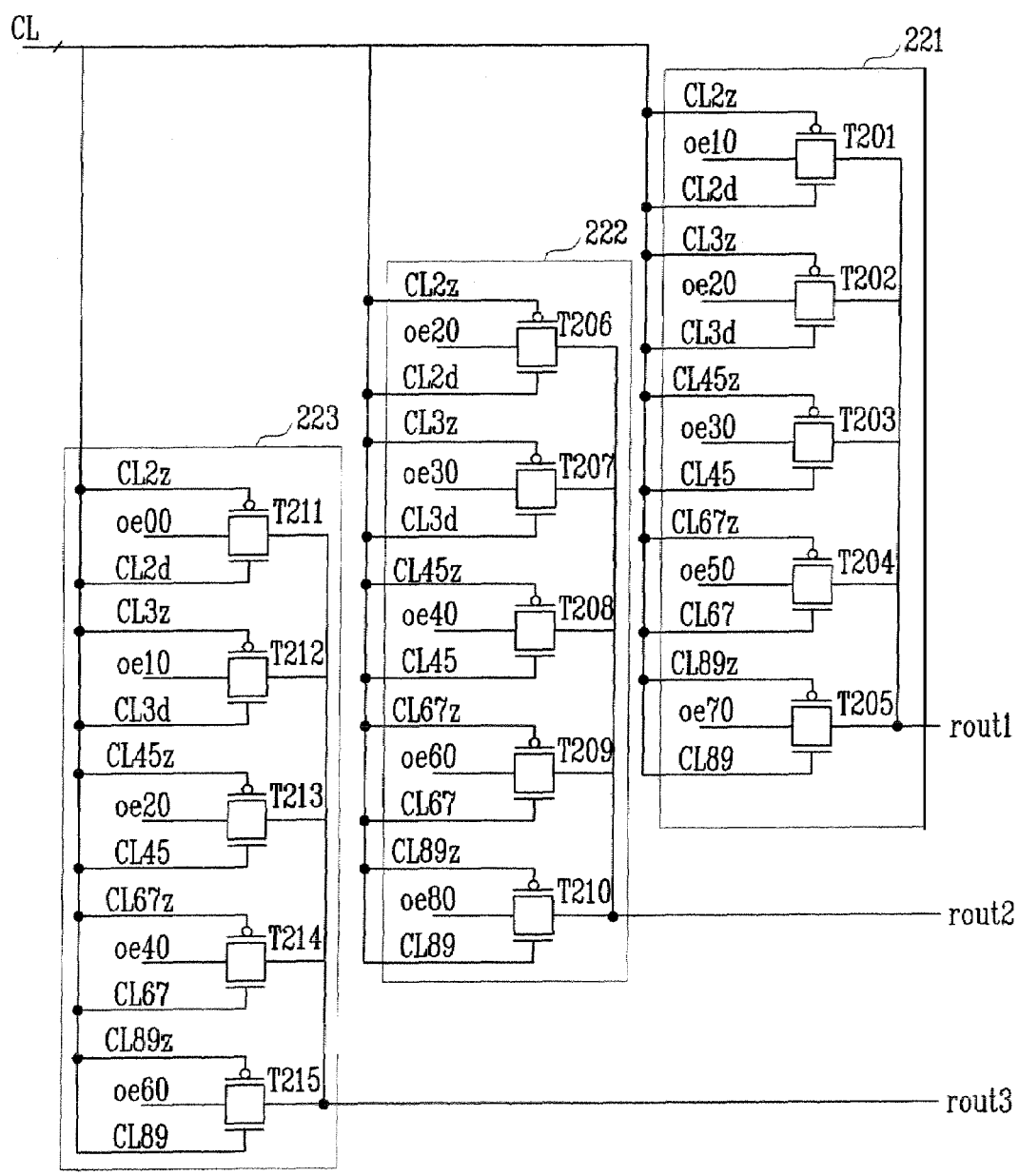
FIG. 4 is a detailed circuit diagram illustrating an output enable signal selecting unit of FIG. 2.

FIG. 4 is a detailed circuit diagram illustrating the output enable signal selecting unit of FIG. 2.

As illustrated in FIG. 4, the output enable signal selecting unit 220 of FIG. 2 includes first to third selecting units 221 to 223. The first to third selecting units 221 to 223 output the first to third select signals rout1, rout2 and rout3, respectively, by selecting one of the output enable signals oe00 to oe80 from the output enable signal generating unit 210 (FIG. 2) according to the CAS latency CL.

The first to third selecting units 221 to 223 have the same structure but receive different signals. The structure and operation of the first selecting unit 221 will now be explained as an example.

The first selecting unit 221 includes five transmission gates T201 to T205 for transmitting the second, third, fourth, sixth or eighth output enable signal oe10, oe20, oe30, oe50 or oe70 from the output enable signal generating unit 210, respectively. The first selecting unit 221 outputs only one output enable signal selected according to the CAS latency CL.

The first transmission gate T201 transmits the second output enable signal oe10 according to first CAS latency signals CL2z and CL2d. The second transmission gate T202 transmits the third output enable signal oe20 according to second CAS latency signals CL3z and CL3d. The third transmission gate T203 transmits the fourth output enable signal oe30 according to third CAS latency signals CL45z and CL45. The fourth transmission gate T204 transmits the sixth output enable signal oe50 according to fourth CAS latency signals CL67z and CL67. The fifth transmission gate T205 transmits the eighth output enable signal oe70 according to fifth CAS latency signals CL89z and CL89.

The second selecting unit 222 has the same structure as that of the first selecting unit 221, and transmits the output enable signal later than the output enable signal selected by the first selecting unit 221 by one cycle according to the CAS latency CL.

The third selecting unit 223 has the same structure as that of the first selecting unit 221, and transmits the output enable signal earlier than the output enable signal selected by the first selecting unit 221 by one cycle according to the CAS latency CL.

For example, when receiving the fifth CAS latency signals CL89z and CL89, the first selecting unit 221 of the output enable signal selecting unit 220 transmits the eighth output enable signal oe70 to be outputted as the first select signal rout1. The second selecting unit 222 transmits the ninth output enable signal oe80 later than the eighth output enable signal oe70 by one cycle to be outputted as the second select signal rout2. The third selecting unit 223 transmits the seventh output enable signal oe60 earlier than the eighth output enable signal oe70 by one cycle to be outputted as the third select signal rout3.

The first to third select signals rout1, rout2 and rout3 are applied to the first and second enable signal generating units 230 and 240, respectively, and used to generate the enable signals routen and fouten for controlling data output or the enable signals rqsen and fqsen for generating the DQS.

The operation for generating the first to fourth pulses routen, fouten, rqsen and fqsen by the first to third select signals rout1, rout2 and rout3 will now be explained.

Figure 5:
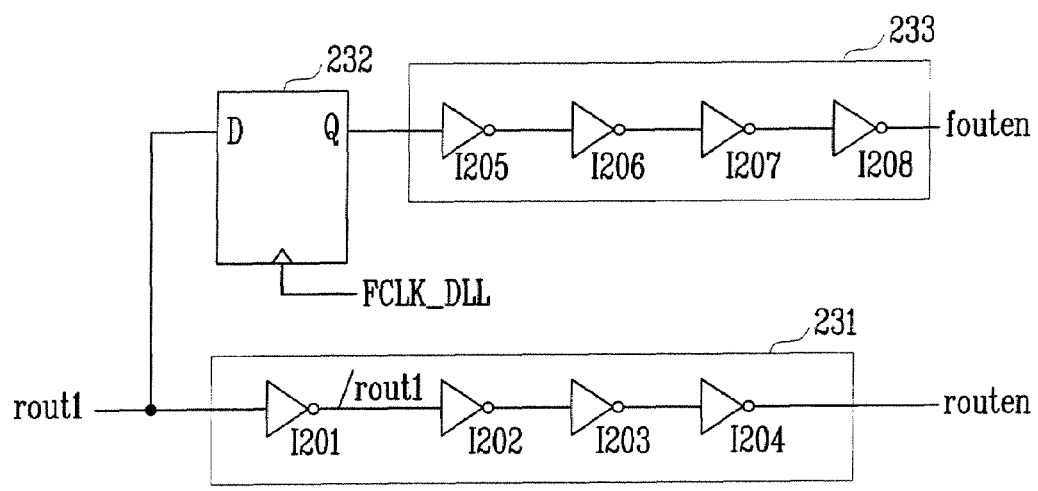
FIG. 5 is a detailed circuit diagram illustrating a first enable signal generating unit of FIG. 2.
Figure 6:
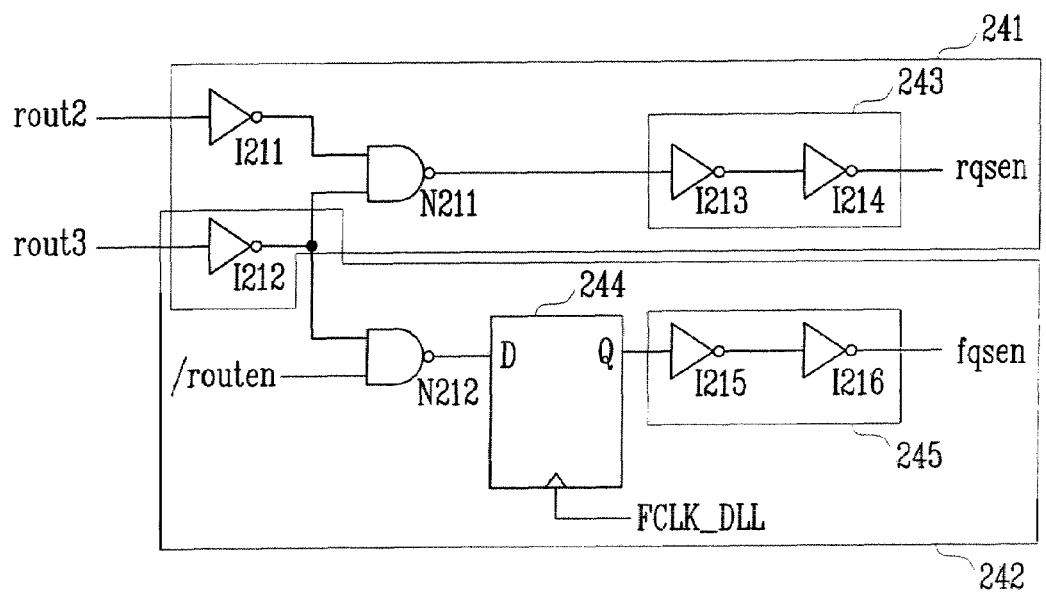
FIG. 6 is a detailed circuit diagram illustrating a second enable signal generating unit of FIG. 2.

FIG. 5 is a detailed circuit diagram illustrating the first enable signal generating unit of FIG. 2. FIG. 6 is a detailed circuit diagram illustrating the second enable signal generating unit of FIG. 2, and FIG. 7 is a waveform diagram showing the operation of the first and second enable signal generating units of FIG. 2.

Figure 7:
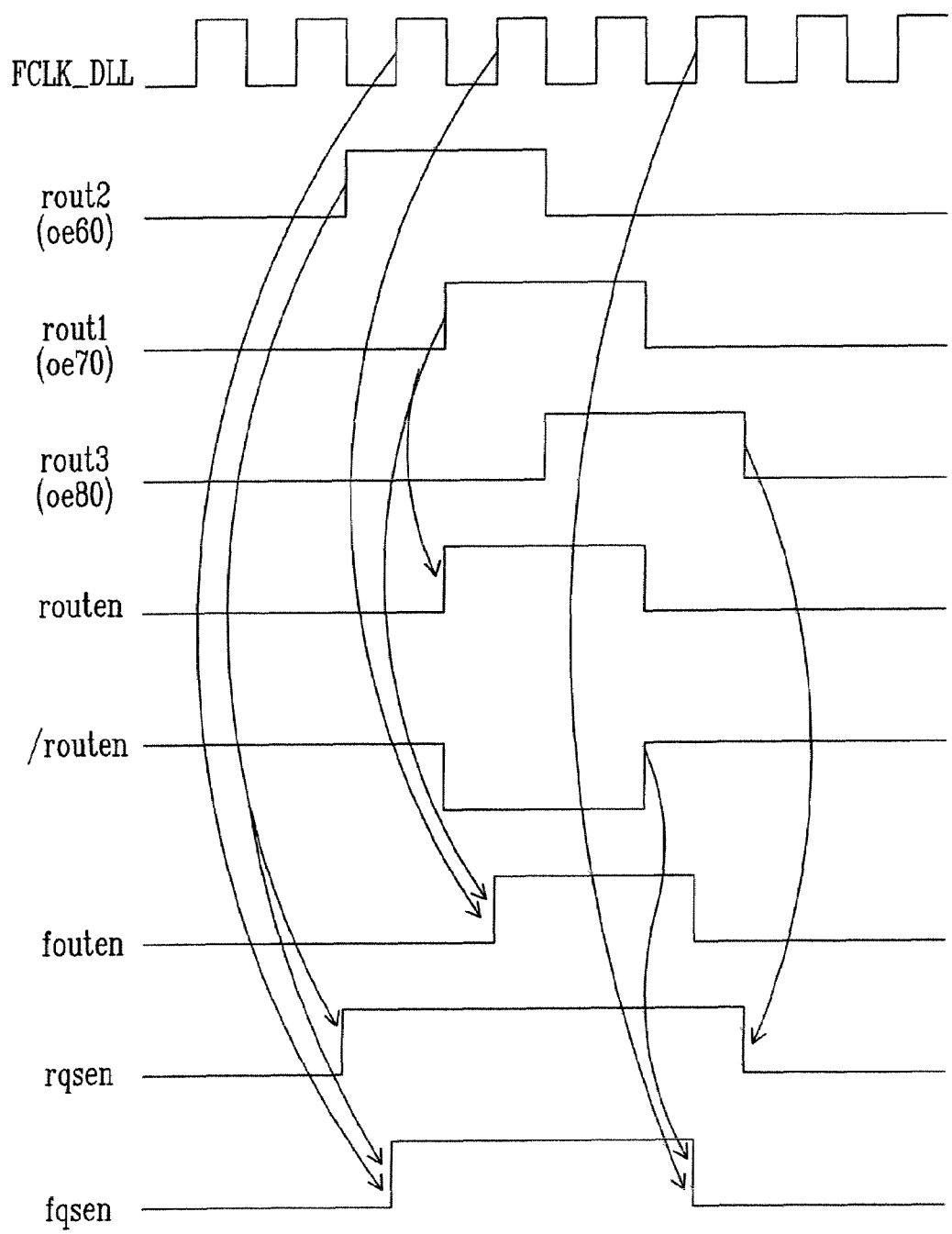
FIG. 7 is a waveform diagram showing the operation of the first and second enable signal generating units of FIG. 2.

Referring to FIGS. 5 and 7, the first enable signal generating unit 230 includes a first buffer unit 231 for receiving the first select signal rout1 and generating the first enable signal routen, a first delay means 232 for synchronizing the first select signal rout1 with the first internal clock signal FCLK_DLL by delaying the first select signal rout1 by half a cycle, and a second buffer unit 233 for outputting the output signal from the first delay means 232 as the second enable signal fouten.

The first select signal rout1 is outputted as the first enable signal routen through the first buffer unit 231. On the other hand, the rising edge of the first select signal rout1 is synchronized with the first internal clock signal FCLK_DLL by the first delay means 232. Here, the first delay means 232 can be a D flip-flop using the first internal clock signal FCLK_DLL as a clock signal.

As shown in FIGS. 6 and 7, the second enable signal generating unit 240 includes a first logic unit 241 for generating the third enable signal rqsen, and a second logic unit 242 for generating the fourth enable signal fqsen.

The first logic unit 241 includes a first inverter I211 for inverting the second select signal rout2, a second inverter I212 for inverting the third select signal rout3, a first NAND gate N211 for receiving the output signals from the first and second inverters I211 and I212, and a third buffer unit 243 for outputting the output signal from the first NAND gate N211 as the third enable signal rqsen.

When the second select signal rout2 or the third select signal rout3 has a high level, the third enable signal rqsen also has a high level.

The second logic unit 242 includes the second inverter I212 for inverting the third select signal rout3, a second NAND gate N212 for receiving the output signal from the second inverter I212, and an inverted signal /routen of the first select signal generated in the first enable signal generating unit 230, a second delay means 244 for synchronizing a rising edge of the output signal from the second NAND gate N212 with the first internal clock signal FCLK_DLL, and a fourth buffer unit 245 for outputting the output signal from the second delay means 244 as the fourth enable signal fqsen.

When the first select signal rout1 or the third select signal rout3 has a high level, the fourth enable signal fqsen also has a high level.

The first to fourth enable signals routen, fouten, rqsen and fqsen are applied to the pulse generating unit 260, respectively, and used to generate the pulses rclkdoqter and fclkdoqter for controlling data output or the pulses rqsdoqter and fqsdoqter for generating the DQS.

Figure 8A:
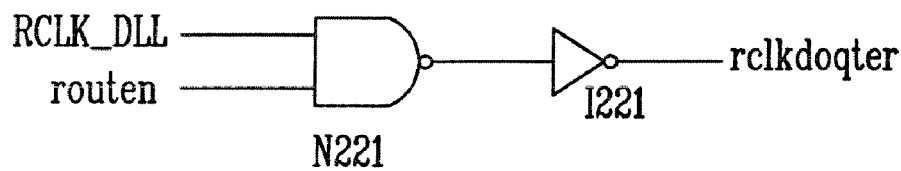
FIGS. 8A to 8D are detailed circuit diagrams illustrating first to fourth pulse generating units of FIG. 2.
Figure 8B:
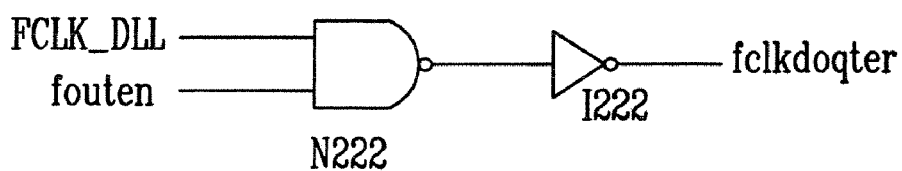
Figure 8C:
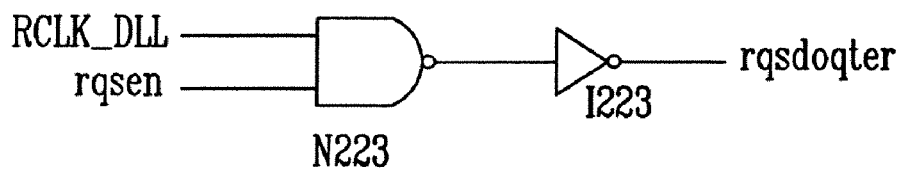
Figure 8D:
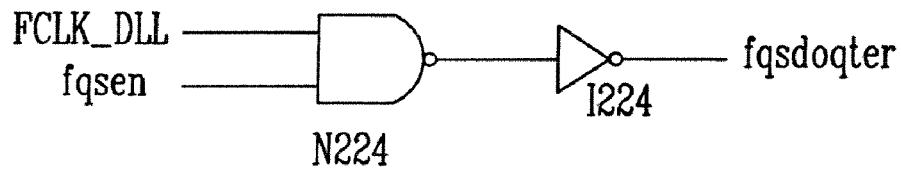
Figure 9:
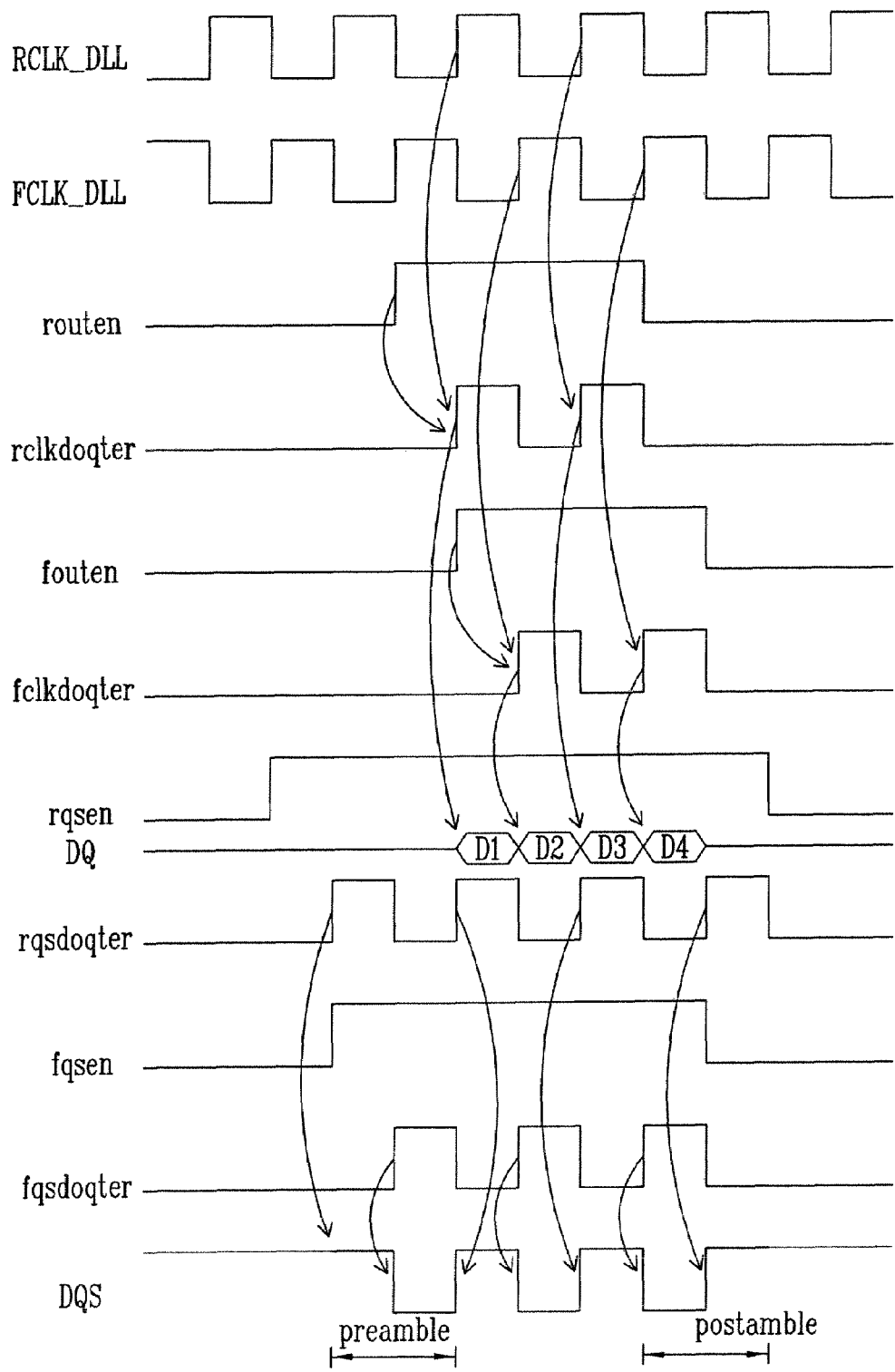
FIG. 9 is a waveform diagram showing the operation of the first to fourth pulse generating units of FIG. 2.

FIGS. 8A to 8D are detailed circuit diagrams illustrating the first to fourth pulse generating units of FIG. 2, and FIG. 9 is a waveform diagram showing the operation of the first to fourth pulse generating units of FIG. 2.

As illustrated in FIGS. 8A and 9, the first pulse generating unit 261 generates the first pulse rclkdoqter according to the second internal clock signal RCLK_DLL and the first enable signal routen. The first pulse generating unit 261 includes a first NAND gate N221 for receiving the second internal clock signal RCLK_DLL and the first enable signal routen and a first inverter I221 for generating the first pulse rclkdoqter by inverting an output signal of the first NAND gate N221.

The first pulse generating unit 261 generates the first pulse rclkdoqter by outputting the second internal clock signal RCLK_DLL only during the application of the first enable signal routen. The first pulse rclkdoqter is outputted in the form of two pulses.

The second pulse generating unit 262 generates the second pulse fclkdoqter according to the first internal clock signal FCLK_DLL and the second enable signal fouten. The second pulse generating unit 262 includes a second NAND gate N222 receiving the first internal clock signal FCLK_DLL and the second enable signal fouten and a second inverter I222 for generating the second pulse fclkdoqter by inverting an output signal of the second NAND gate N222.

The second pulse generating unit 262 generates the second pulse fclkdoqter by outputting the first internal clock signal FCLK_DLL only during the application of the second enable signal fouten. The second pulse fclkdoqter is outputted in the form of two pulses later than the first pulse rclkdoqter by half a cycle.

The third pulse generating unit 263 has the same structure with the second pulse generation unit 262, and generates the third pulse rqsdoqter by outputting the second internal clock signal RCLK_DLL only during the application of the third enable signal rqsen. The third pulse rqsdoqter is generated earlier than the first pulse rclkdoqter by one cycle, maintained later than the first pulse rclkdoqter by one cycle, and outputted in the form of four pulses.

The fourth pulse generating unit 264 has the same structure with the second pulse generation unit 263, and generates the fourth pulse fqsdoqter by outputting the first internal clock signal FCLK_DLL only during the application of the fourth enable signal fqsen. The fourth pulse fqsdoqter is generated earlier than the first pulse rclkdoqter by half a cycle, maintained later than the first pulse rclkdoqter by half a cycle, and outputted in the form of three pulses.

The following simulation results show generation of the first to fourth pulses rclkdoqter, fclkdoqter, rqsdoqter and fqsdoqter by the first to fourth enable signals routen, fouten, rqsen and fqsen.

Figure 10:
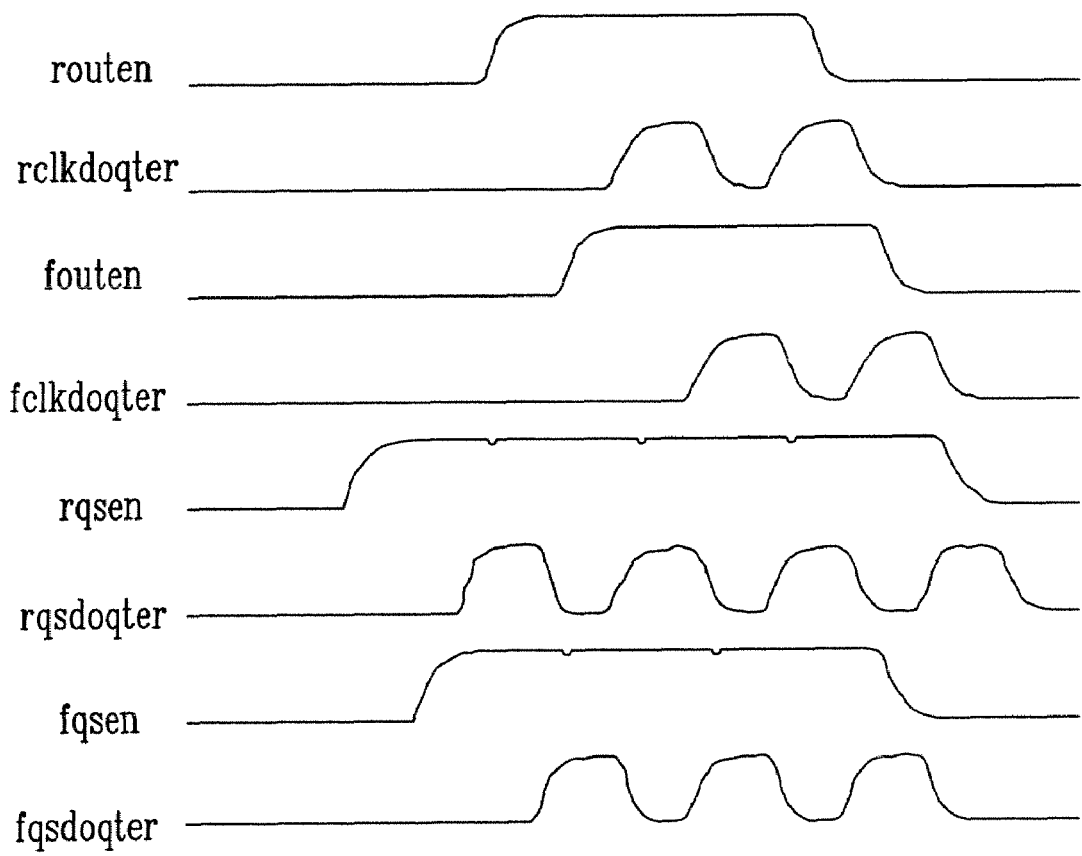
FIG. 10 is a waveform diagram showing simulation results of the circuit for generating the DQS in the DDR memory device in accordance with the preferred embodiment of the present invention.

FIG. 10 is a waveform diagram showing simulation results of the circuit for generating the DQS in the DDR memory device in accordance with the preferred embodiment of the present invention.

As shown in FIG. 10, the first pulse rclkdoqter is generated in the form of two pulses during the application of the first enable signal routen, and the second pulse fclkdoqter is generated in the form of two pulses during the application of the second enable signal fouten. The first pulse rclkdoqter is generated by the second internal clock signal RCLK_DLL, and the second pulse fclkdoqter is generated by the first internal clock signal FCLK_DLL. Accordingly, a generation time point of the first pulse rclkdoqter is different from that of the second pulse fclkdoqter by half a cycle.

The first and second pulses rclkdoqter and fclkdoqter are used as data output control signals, and thus data are outputted in every four rising edge. The four data (D1 to D4 of FIG. 9) are outputted.

The third pulse rqsdoqter is generated in the form of four pulses during the application of the third enable signal rqsen, and the fourth pulse fqsdoqter is generated in the form of three pulses during the application of the fourth enable signal fqsen. The third pulse rqsdoqter is generated by the second internal clock signal RCLK_DLL, and the fourth pulse fqsdoqter is generated by the first internal clock signal FCLK_DLL. Accordingly, generation and end time points of the third pulse rqsdoqter is different from those of the fourth pulse fqsdoqter by half a cycle.

One cycle from the first rising edge of the third pulse rqsdoqter generated earlier than the fourth pulse fqsdoqter is set to be the preamble period of the DQS, and half a cycle from the fourth rising edge, namely the last rising edge of the third pulse rqsdoqter is set to be the postamble period of the DQS. As a result, the preamble period and the postamble period of the DQS can be precisely set.

As described earlier, in accordance with the present invention, the circuit for generating the DQS in the DDR memory device and the method therefor can precisely distinguish the preamble and postamble periods of the DQS by generating the pulses for generating the DQS only in the DQS input period by using the internal clock signal according to the CAS latency under the read command, and generating the DQS by using the pulses, and can improve reliability of the circuit operation by precisely controlling operation timing with the internal clock signal.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A circuit for controlling data output and data strobe signal generation in a DDR memory device, comprising:
    an internal clock generating unit for generating first and second internal clock signals;
    an enable signal generating unit for generating first and second enable signals according to a CAS latency and the first internal clock signal;
    a first pulse generating unit for generating a first pulse signal to set a preamble and a postamble periods of a data strobe signal in response to the second internal clock signal while the first enable signal is inputted;
    a second pulse generating unit for generating a second pulse signal in response to the first internal clock signal while the second enable signal is inputted; and
    a data strobe signal generating unit for generating the data strobe signal in response to the first and second pulse signals.

2. The circuit of claim 1, wherein the enable signal generating unit comprises:
    an output enable signal generating unit for sequentially generating output enable signals having a single pulse at a predetermined interval;
    an output enable signal selecting unit for selecting three of the output enable signals according to CAS latency, and outputting the three output enable signals as first to third select signals;
    a first enable signal generating unit for generating the first and the second enable signals according to the first and the second select signals and the first internal clock signal, respectively.

3. The circuit of claim 2, wherein the output enable signal generating unit generates the output enable signals to have a two cycle pulse width in every one cycle.

4. The circuit of claim 2, wherein the output enable signal selecting unit outputs the three output enable signals consecutively generated at one cycle interval among the output enable signals as the first to third select signals.

5. The circuit of claim 2, wherein the output enable signal selecting unit comprises:
    a first selecting unit for outputting a third output enable signal of the output enable signals as the third select signal according to the CAS latency;
    a second selecting unit for outputting a first output enable signal of the output enable signals later than the third output enable signal by one cycle as the first select signal according to the CAS latency; and
    a third selecting unit for outputting the a second output enable signal of the output signals earlier than the third output enable signal by one cycle as the second select signal according to the CAS latency.

6. The circuit of claim 2, wherein the first enable signal generating unit comprises:
    a first inverter for inverting the first select signal;
    a second inverter for inverting the second select signal;
    a first NAND gate operated according to the output signals from the first and second inverters;
    a first buffer unit for outputting an output signal from the first NAND gate as the first enable signal;
    a second NAND gate operated according to an output signal from the second inverter and an inverted signal of the second select signal;
    a delay unit for generating the second enable signal different from the first enable signal by half a cycle by synchronizing a rising edge of an output signal from the second NAND gate with a rising edge of the first internal clock signal; and
    a second buffer unit for outputting the second enable signal.

7. The circuit of claim 6, wherein the delay unit is a D flip-flop using a clock signal as the first internal clock signal.

8. The circuit of claim 1, wherein the first pulse generating unit comprises:
    a NAND gate for logically combining the second internal clock signal and the first enable signal; and
    an inverter for outputting the first pulse signal by inverting an output signal of the NAND gate.

9. The circuit of claim 1, wherein the second pulse generating unit comprises:
    a NAND gate for logically combining the first internal clock signal and the second enable signal; and
    an inverter for outputting the second pulse signal by inverting an output signal of the NAND gate.

10. The circuit of claim 2, wherein the enable signal generating unit further comprises a second enable signal generating unit for generating third and fourth enable signals according to the third select signal and the first internal clock signal, respectively.

11. The circuit of claim 10, wherein the second enable signal generating unit comprises:
    a first buffer unit for outputting the third select signal as the third enable signal;
    a delay unit for generating the fourth enable signal different from the third enable signal by half a cycle by synchronizing a rising edge of the third select signal with a rising edge of the first internal clock signal; and
    a second buffer unit for outputting the fourth enable signal.

12. The circuit of claim 11, wherein the delay unit is a D flip-flop using a clock signal as the first internal clock signal.

13. The circuit of claim 10, further comprising:
    a third pulse generating unit for generating a third pulse signal using the second internal clock signal to control the generation of the data output while the third enable signal is inputted; and
    a fourth pulse generating unit for generating a fourth pulse signal using the first internal clock signal to control the generation of the data output while the fourth enable signal is inputted.

14. The circuit of claim 13, wherein the third pulse generating unit comprises:
    a NAND gate for logically combining the second internal clock signal and the third enable signal; and
    an inverter for outputting the third pulse signal by inverting an output signal of the NAND gate.

15. The circuit of claim 13, wherein the fourth pulse generating unit comprises:
    a NAND gate for logically combining the first internal clock signal and the fourth enable signal; and
    an inverter for outputting the fourth pulse signal by inverting an output signal of the NAND gate.

* * * * *